(12) United States Patent
Cho et al.

(10) Patent No.: US 9,093,392 B2
(45) Date of Patent: Jul. 28, 2015

(54) INTEGRATED CIRCUIT PACKAGING SYSTEM WITH VERTICAL INTERCONNECTION AND METHOD OF MANUFACTURE THEREOF

(75) Inventors: SungWon Cho, Icheon-si (KR); JoHyun Bae, Seoul (KR); DaeSik Choi, Seoul (KR); DongSoo Moon, Ichon-si (KR)

(73) Assignee: STATS ChipPAC Ltd., Singapore (SG)

( * ) Notice: Subject to any disclaimer, the term of this patent is extended or adjusted under 35 U.S.C. 154(b) by 31 days.

(21) Appl. No.: 12/965,018

(22) Filed: Dec. 10, 2010

(65) Prior Publication Data

US 2012/0146229 A1 Jun. 14, 2012

(51) Int. Cl.
*H01L 23/48* (2006.01)
*H01L 23/31* (2006.01)
(Continued)

(52) U.S. Cl.
CPC ............ *H01L 23/3128* (2013.01); *H01L 23/13* (2013.01); *H01L 23/49811* (2013.01); *H01L 23/49816* (2013.01); *H01L 25/0657* (2013.01); *H01L 25/105* (2013.01); *H01L 25/16* (2013.01); *H01L 25/50* (2013.01); *H01L 24/16* (2013.01); *H01L 24/32* (2013.01); *H01L 24/48* (2013.01); *H01L 24/73* (2013.01); *H01L 25/0652* (2013.01); *H01L 2224/12105* (2013.01); *H01L 2224/16145* (2013.01); *H01L 2224/16225* (2013.01); *H01L 2224/32225* (2013.01); *H01L 2224/4824* (2013.01); *H01L 2224/48091* (2013.01); *H01L 2224/48227* (2013.01); *H01L 2224/73207* (2013.01); *H01L 2224/73215* (2013.01); *H01L 2224/73265* (2013.01); *H01L 2224/92147* (2013.01); *H01L 2225/0651* (2013.01); *H01L 2225/06513* (2013.01); *H01L 2225/06586* (2013.01); *H01L 2225/107* (2013.01); *H01L 2225/1023* (2013.01); *H01L 2225/1052* (2013.01); *H01L 2225/1058* (2013.01);
(Continued)

(58) Field of Classification Search
CPC .............. H01L 21/486; H01L 2224/16; H01L 2924/01019; H01L 2924/01025; H01L 2924/01057; H01L 2924/01078; H01L 2924/01079; H01L 2924/09701; H01L 2924/15311; H01L 2924/3011
USPC ........... 257/E21.511, E23.141, E25.013, 686, 257/690
See application file for complete search history.

(56) References Cited

U.S. PATENT DOCUMENTS 6,132,853 A * 10/2000 Noddin ........................ 428/209
6,388,333 B1 5/2002 Taniguchi et al.
(Continued)

*Primary Examiner* — Stephen W Smoot
*Assistant Examiner* — Edward Chin
(74) *Attorney, Agent, or Firm* — Ishimaru & Associates LLP

(57) ABSTRACT

A method of manufacture of an integrated circuit packaging system includes: providing a package substrate having a package substrate bottom side, a package substrate top side, and a package substrate window; mounting a base integrated circuit over the package substrate, the base integrated circuit having a base inactive side and a base active side facing the package substrate top side; attaching a lower internal connector to the base active side and the package substrate bottom side, the lower internal connector through the package substrate window; forming an upper insulation conformal to the base integrated circuit and the package substrate top side, the upper insulation having an upper insulation top side; and forming a peripheral through-insulation connector through the upper insulation, the peripheral through-insulation connector having a peripheral connector bottom side directly on the package substrate top side and a peripheral connector top side coplanar with the upper insulation top side.

20 Claims, 9 Drawing Sheets

(51) Int. Cl.
*H01L 23/13* (2006.01)
*H01L 23/498* (2006.01)
*H01L 25/10* (2006.01)
*H01L 25/00* (2006.01)
*H01L 25/16* (2006.01)
*H01L 23/00* (2006.01)
*H01L 25/065* (2006.01)

(52) U.S. Cl.
CPC .......... *H01L2225/1082* (2013.01); *H01L 2924/10253* (2013.01); *H01L 2924/10329* (2013.01); *H01L 2924/15311* (2013.01); *H01L 2924/15321* (2013.01); *H01L 2924/1815* (2013.01); *H01L 2924/18165* (2013.01); *H01L 2924/3511* (2013.01)

(56) References Cited

U.S. PATENT DOCUMENTS

| | | |
|---|---|---|
| 6,798,057 B2 | 9/2004 | Bolkin et al. |
| 6,870,274 B2 | 3/2005 | Huang |
| 7,262,080 B2 * | 8/2007 | Go et al. ............... 438/109 |
| 7,345,361 B2 | 3/2008 | Mallik et al. |
| 7,537,966 B2 | 5/2009 | Connell et al. |
| 7,642,636 B2 | 1/2010 | Park et al. |
| 7,649,248 B2 * | 1/2010 | Baek ..................... 257/686 |
| 7,714,453 B2 | 5/2010 | Khan et al. |
| 7,777,351 B1 * | 8/2010 | Berry et al. ............ 257/778 |
| 7,902,663 B2 * | 3/2011 | Fan ........................ 257/711 |
| 7,911,070 B2 * | 3/2011 | Pagaila et al. ......... 257/787 |
| 7,932,590 B2 * | 4/2011 | Lam ...................... 257/686 |
| 8,004,089 B2 * | 8/2011 | Jobetto ................... 257/773 |
| 2007/0216006 A1 * | 9/2007 | Park et al. ............... 257/686 |
| 2008/0073769 A1 * | 3/2008 | Wu et al. ................. 257/686 |
| 2009/0127715 A1 * | 5/2009 | Shin et al. ............... 257/777 |
| 2009/0140407 A1 * | 6/2009 | Chow et al. ............. 257/686 |
| 2009/0236720 A1 | 9/2009 | Yoon et al. |
| 2009/0236726 A1 * | 9/2009 | Retuta et al. ........... 257/690 |
| 2010/0044845 A1 * | 2/2010 | Funaya et al. .......... 257/685 |
| 2010/0072596 A1 | 3/2010 | Pagaila et al. |
| 2010/0171205 A1 | 7/2010 | Chen et al. |

* cited by examiner ated circuit packaging system with interconnec- 10 package substrate top side, and a package substrate window;

INTEGRATED CIRCUIT PACKAGING SYSTEM WITH VERTICAL INTERCONNECTION AND METHOD OF MANUFACTURE THEREOF

TECHNICAL FIELD

The present invention relates generally to an integrated circuit packaging system, and more particularly to a system for an integrated circuit packaging system with interconnection.

BACKGROUND ART

In the electronics industry, the tendency has been to reduce the size of electronic devices such as camcorders and portable telephones while increasing performance and speed. Integrated circuit packages for complex systems typically are comprised of multiple interconnected integrated circuit chips. The integrated circuit chips usually are made from a semiconductor material such as silicon or gallium arsenide. The integrated circuit chips may be mounted in packages that are then mounted on printed wiring boards.

Typically, the packages on which the integrated semiconductor chips are mounted include a substrate or other chip-mounting device. Substrates are parts that provide a package with mechanical base support and a form of electrical interface that would allow the external world to access the devices housed within the package.

A Package-on-Package (PoP) package is a 3-dimentional (3D) package in which fully tested packages, typically referred to as Known Good Packages (KGPs), are stacked on top of one another during the board mounting process. A conventional PoP package usually consists of a bottom package and a top package and has a two-tiered configuration. The bottom package is typically an ASIC or baseband chip and the top package may be other functional chip such as memory. Typically, both the bottom package and the top package have a laminated substrate or interposer.

The modern trend of semiconductor manufacturing and packaging technology requires multiple chips with different functionalities such as radio-frequency (RF), logic, analog, base-band, and memory be packaged into a single integrated circuit system. Conventional PoP package is facing increasing challenge to accommodate more and more functional chips in a single package with tight space constraint. The conventional two-tiered configuration can no longer fulfill this purpose effectively.

Thus, a need still remains for accommodating the modern trend of semiconductor manufacturing and packaging, reducing the package footprint, increasing functionality integration, and increasing the packaging density. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a package substrate having a package substrate bottom side, a package substrate top side, and a package substrate window; mounting a base integrated circuit over the package substrate, the base integrated circuit having a base inactive side and a base active side facing the package substrate top side; attaching a lower internal connector to the base active side and the package substrate bottom side, the lower internal connector through the package substrate window; forming an upper insulation conformal to the base integrated circuit and the package substrate top side, the upper insulation having an upper insulation top side; and forming a peripheral through-insulation connector through the upper insulation, the peripheral through-insulation connector having a peripheral connector bottom side directly on the package substrate top side and a peripheral connector top side coplanar with the upper insulation top side.

The present invention provides an integrated circuit packaging system, including: a package substrate having a package substrate bottom side, a package substrate top side, and a package substrate window; a base integrated circuit over the package substrate, the base integrated circuit having a base inactive side and a base active side facing the package substrate top side; a lower internal connector attached to the base active side and the package substrate bottom side, the lower internal connector through the package substrate window; an upper insulation conformal to the base integrated circuit and the package substrate top side, the upper insulation having an upper insulation top side; and a peripheral through-insulation connector through the upper insulation, the peripheral through-insulation connector having a peripheral connector bottom side directly on the package substrate top side and a peripheral connector top side coplanar with the upper insulation top side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
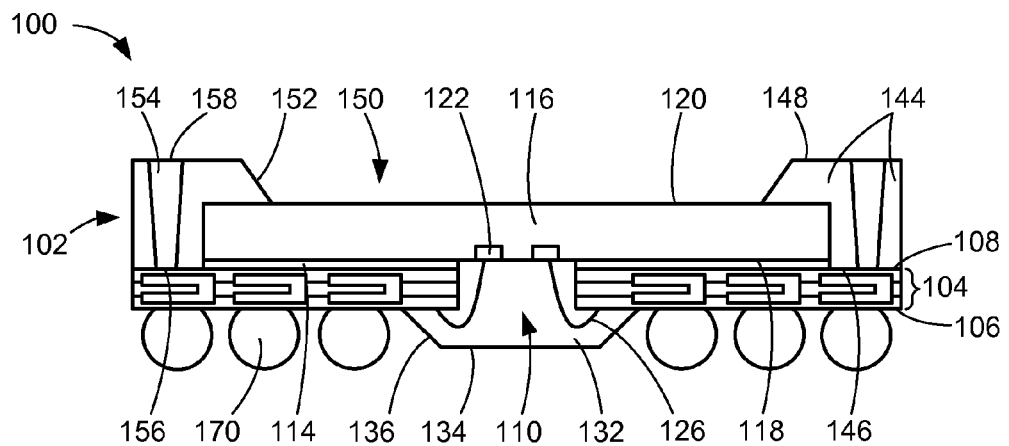
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Providing package stacking and reducing package profile are important for board on chip (BOC) packaging. Embodiments of the present invention provide a stack package structure having a reduced profile.

Figure 2:
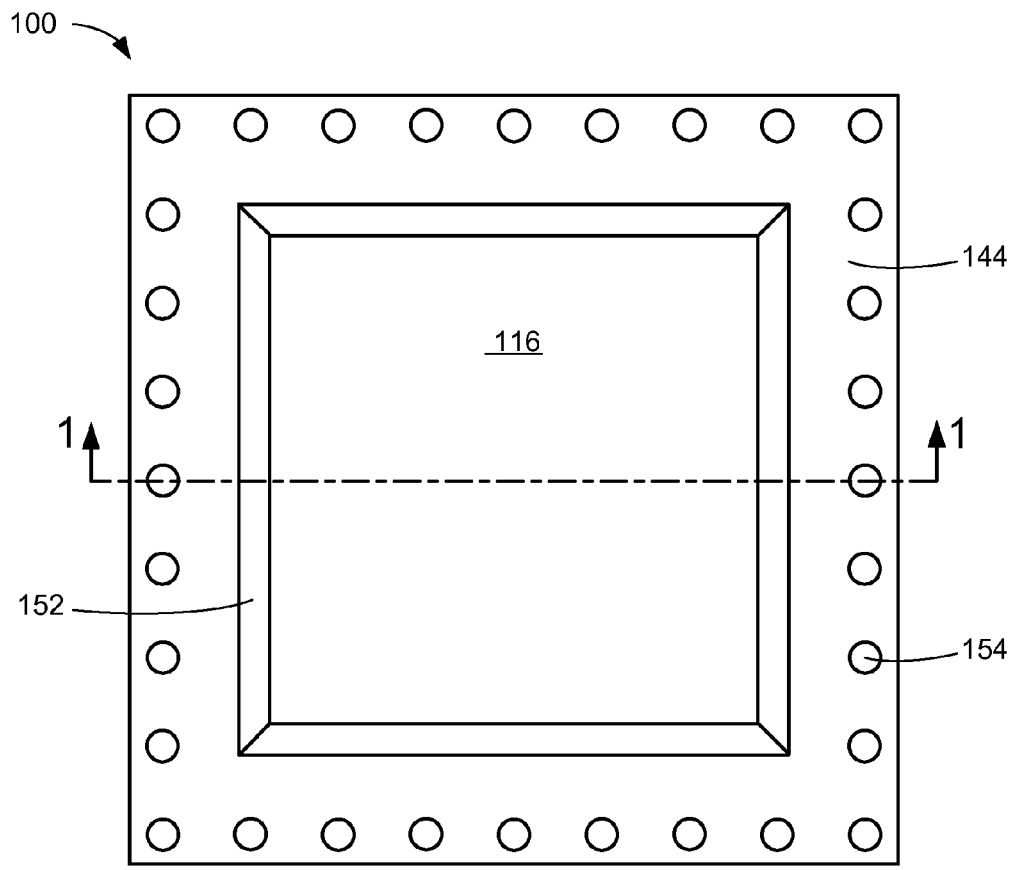
FIG. 2 is a top view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include a board on chip (BOC) stack structure using a molded laser package (MLP) with a fan-in structure, a redistribution layer (RDL), or a combination thereof.

The integrated circuit packaging system 100 can include a stack structure 102. The stack structure 102 can include a package substrate 104 having a package substrate bottom side 106 and a package substrate top side 108 opposite the package substrate bottom side 106.

The package substrate 104 can include a package substrate window 110, such as a hole through the package substrate bottom side 106 and the package substrate top side 108. The package substrate 104 can include a number of conductive layers providing electrical connectivity between the package substrate bottom side 106 and the package substrate top side 108.

The stack structure 102 can include an adhesive layer 114 attached to the package substrate 104 and a base integrated circuit 116. The adhesive layer 114 can be attached to the package substrate top side 108 and a base active side 118 of the base integrated circuit 116. The base integrated circuit 116 is preferably a semiconductor device, such as a chip or an integrated circuit die.

The base integrated circuit 116 can include the base active side 118 facing the package substrate top side 108. The base integrated circuit 116 can include a base inactive side 120 opposite the base active side 118.

The base integrated circuit 116 can include base pads 122 at a central region of the base active side 118. The base integrated circuit 116 can be mounted over the package substrate 104 with the base pads 122 above the package substrate window 110.

The stack structure 102 can include lower internal connectors 126 connected or attached to the base pads 122 and the package substrate bottom side 106 providing electrical conductivity. A number of the lower internal connectors 126 can be formed through the package substrate window 110.

The stack structure 102 can include a lower insulation 132, which covers a semiconductor component or an electrical connector providing mechanical and environmental protection. The lower insulation 132 can be applied over the package substrate bottom side 106, the package substrate window 110, the base active side 118, and the lower internal connectors 126.

The lower insulation 132 can include a lower insulation bottom side 134 below the package substrate bottom side 106. The lower insulation 132 can include a lower insulation sidewall 136 at an obtuse angle to the lower insulation bottom side 134 or at an acute angle to a portion of the package substrate bottom side 106 that is covered with the lower insulation 132.

The stack structure 102 can include an upper insulation 144, which covers a semiconductor component or an electrical connector providing mechanical and environmental protection. The upper insulation 144 can be applied over the base inactive side 120, the adhesive layer 114, and the package substrate top side 108. The upper insulation 144 can include an upper insulation bottom side 146 directly on the package substrate top side 108. The upper insulation 144 can be conformal to at least non-horizontal sides of the base integrated circuit 116 and the package substrate top side 108.

The upper insulation 144 can include an upper insulation top side 148 opposite the upper insulation bottom side 146 and above the base inactive side 120. The upper insulation 144 can include an upper insulation cavity 150 at the upper insulation top side 148.

The upper insulation 144 can include an upper insulation sidewall 152 bounding horizontal extents of the upper insulation cavity 150. The base inactive side 120 defines a bottom extent of the upper insulation cavity 150. The upper insulation sidewall 152 can be at an acute angle to a portion of the base inactive side 120 that is covered with the upper insulation 144.

The stack structure 102 can include peripheral through-insulation connectors 154 providing electrical conductivity to the package substrate 104 through the upper insulation 144 and adjacent a periphery of the upper insulation 144. The peripheral through-insulation connectors 154 can surround non-horizontal sides of the base integrated circuit 116. The peripheral through-insulation connectors 154 include straight non-horizontal sides within the upper insulation 144.

Each of the peripheral through-insulation connectors 154 can include a peripheral connector bottom side 156 directly on the package substrate top side 108. Each of the peripheral through-insulation connectors 154 can include a peripheral connector top side 158 opposite the peripheral connector bottom side 156.

The peripheral connector top side 158 can be exposed from the upper insulation 144 at the upper insulation top side 148. A plane of the peripheral connector top side 158 can be coplanar with a plane of the upper insulation top side 148. The base integrated circuit 116 is below the peripheral connector top side 158 and exposed from the upper insulation 144 within the upper insulation cavity 150.

The integrated circuit packaging system 100 can include package interconnects 170. The package interconnects 170 can be attached to the package substrate bottom side 106 providing electrical conductivity. The package interconnects 170 can be formed in multiple rows or a peripheral array surrounding the lower insulation 132.

It has been discovered that the peripheral through-insulation connectors 154 improve alignment for top package mounting due to the peripheral connector top side 158 coplanar with the upper insulation top side 148 providing a board on chip (BOC) stack structure with an effective molded laser package (MLP) z-interconnection.

It has also been discovered that the package substrate 104 significantly reduces a package profile by providing the package substrate window 110 as a through hole for attaching the lower internal connectors 126 to the base integrated circuit 116 and the package substrate 104.

It has been unexpectedly found that the peripheral through-insulation connectors 154 having a rigid stack structure reduce warpage for mounting a top package thereby improving reliability for an exposed solder-on-pad package-on-package (eSOP-PoP) with large dies.

It has been unexpectedly determined that the upper insulation 144 eliminates package mounting alignment with the upper insulation cavity 150 providing spacing for mounting a top package having a semiconductor device within the upper insulation cavity 150.

It has been unexpectedly recognized that the peripheral through-insulation connectors 154 directly on the package substrate top side 108 and exposed from the upper insulation 144 improve package stacking as well as reduce package profile using molded laser package (MLP) instead of redistribution layer (RDL) and wire bond to connect a known good unit (KGU) to the stack structure 102.

It has been unexpectedly observed that the peripheral through-insulation connectors 154 formed through the upper insulation 144 with a filled conductive element significantly reduce pad pitch.

Referring now to FIG. 2, therein is shown a top view of the integrated circuit packaging system 100. A portion of the base integrated circuit 116 surrounded by the upper insulation sidewall 152 can be exposed from the upper insulation 144. The base integrated circuit 116 can be surrounded by the peripheral through-insulation connectors 154.

The peripheral through-insulation connectors 154 can be exposed from the upper insulation 144. The peripheral through-insulation connectors 154 can be formed in a peripheral array or a number of rows adjacent, along, or within a periphery of the upper insulation 144. For illustrative purposes, each of the peripheral through-insulation connectors 154 is shown having a shape of a circle, although it is understood that the peripheral through-insulation connectors 154 can include any other shape.

Figure 3:
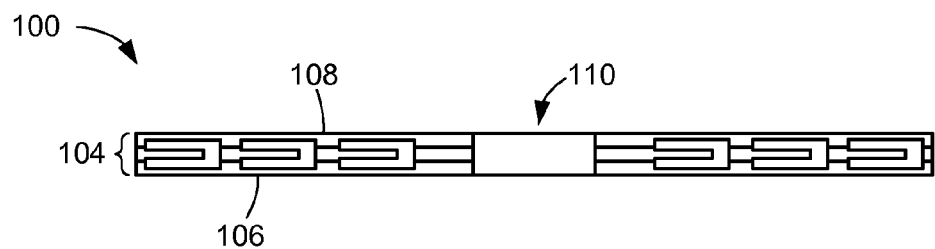
FIG. 3 is a cross-sectional view of the integrated circuit packaging system in a substrate-providing phase.

Referring now to FIG. 3, therein is shown a cross-sectional view of the integrated circuit packaging system 100 in a substrate-providing phase. The package substrate 104 can include the package substrate window 110 through the package substrate 104. The package substrate window 110 can be through the package substrate bottom side 106 and the package substrate top side 108.

Figure 4:
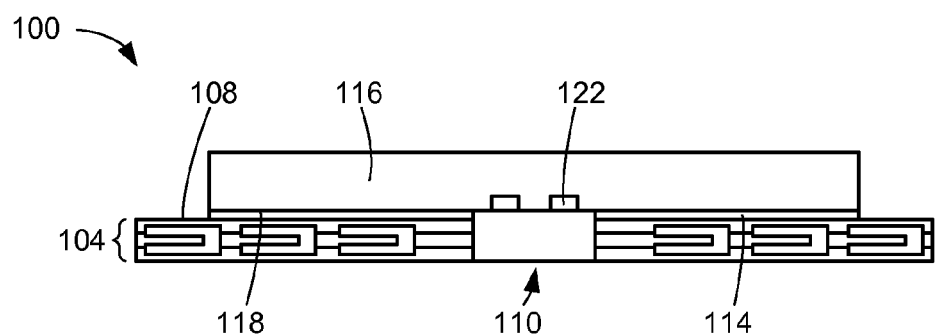
FIG. 4 is the structure of FIG. 3 in a device-attaching phase.

Referring now to FIG. 4, therein is shown the structure of FIG. 3 in a device-attaching phase. The integrated circuit packaging system 100 can include the adhesive layer 114 attached to the package substrate top side 108 of the package substrate 104 and the base active side 118 of the base integrated circuit 116.

The base integrated circuit 116 can include the base pads 122 at the base active side 118. The base integrated circuit 116 can be mounted over the package substrate 104 with the base pads 122 above the package substrate window 110.

Figure 5:
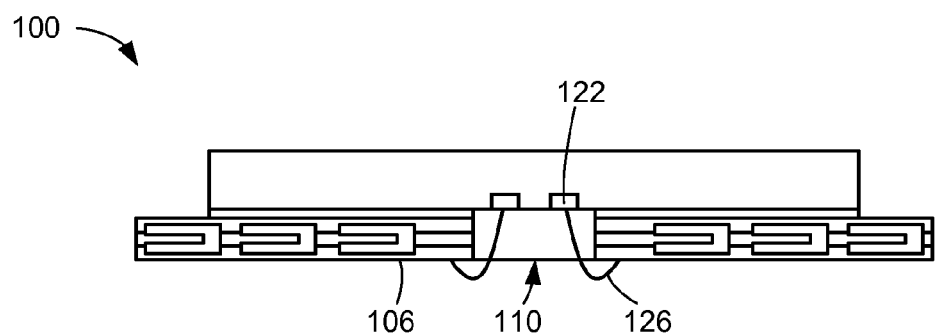
FIG. 5 is the structure of FIG. 4 in a device connection phase.

Referring now to FIG. 5, therein is shown the structure of FIG. 4 in a device connection phase. The integrated circuit packaging system 100 can include the lower internal connectors 126 connected or attached to the base pads 122 and the package substrate bottom side 106 providing electrical conductivity.

A number of the lower internal connectors 126 can be formed through the package substrate window 110. For example, the lower internal connectors 126 can be formed with an attaching process, such as wire bonding.

Figure 6:
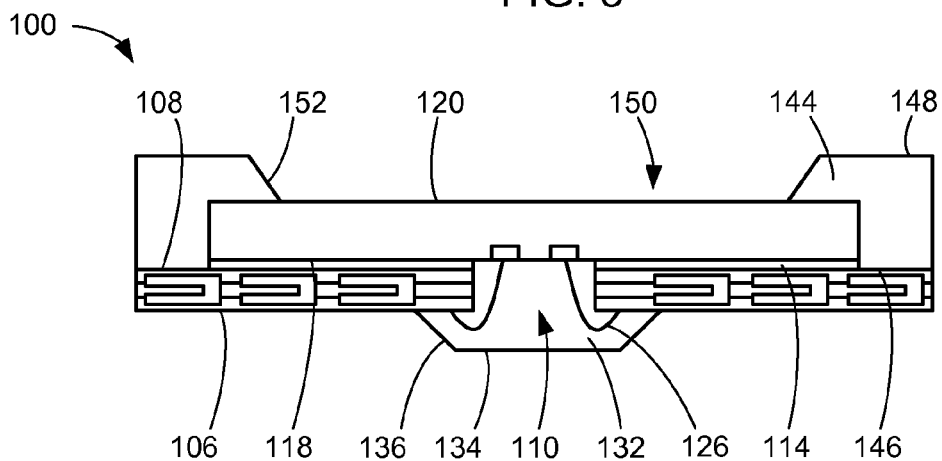
FIG. 6 is the structure of FIG. 5 in a molding phase.

Referring now to FIG. 6, therein is shown the structure of FIG. 5 in a molding phase. The integrated circuit packaging system 100 can include the lower insulation 132 molded over the package substrate bottom side 106, the package substrate window 110, the base active side 118, and the lower internal connectors 126.

The lower insulation 132 can include the lower insulation bottom side 134 below the package substrate bottom side 106. The lower insulation sidewall 136 of the lower insulation 132 can be at an obtuse angle to the lower insulation bottom side 134 or at an acute angle to a portion of the package substrate bottom side 106 that is covered with the lower insulation 132. The lower insulation sidewall 136 can include a taper side to facilitate release of a mold chase.

The integrated circuit packaging system 100 can include the upper insulation 144. The upper insulation 144 can be applied over the base inactive side 120, the adhesive layer 114, and the package substrate top side 108. The upper insulation 144 can include the upper insulation bottom side 146 directly on the package substrate top side 108.

The upper insulation 144 can include the upper insulation top side 148 opposite the upper insulation bottom side 146 and above the base inactive side 120. The upper insulation 144 can include the upper insulation cavity 150 at the upper insulation top side 148.

The upper insulation 144 can include the upper insulation sidewall 152 bounding horizontal extents of the upper insulation cavity 150. The base inactive side 120 defines a bottom extent of the upper insulation cavity 150. The upper insulation sidewall 152 can be at an acute angle to a portion of the base inactive side 120 that is covered with the upper insulation 144. The upper insulation sidewall 152 can include a taper side to facilitate release of a mold chase.

Figure 7:
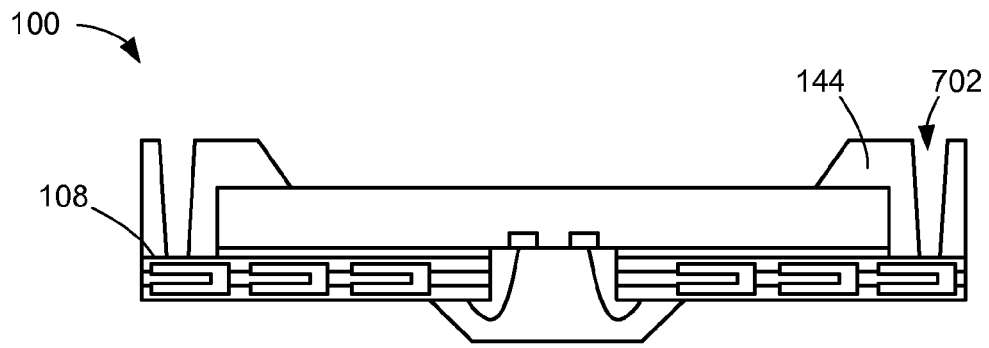
FIG. 7 is the structure of FIG. 6 in a partial removal phase.

Referring now to FIG. 7, therein is shown the structure of FIG. 6 in a partial removal phase. The integrated circuit packaging system 100 can include a hole formation process including laser, drilling, etching, or a mold chase with a protrusion. Upper insulation holes 702 of the upper insulation 144 can be formed through the upper insulation 144. A number of the upper insulation holes 702 can be formed above and to the package substrate top side 108.

Figure 8:
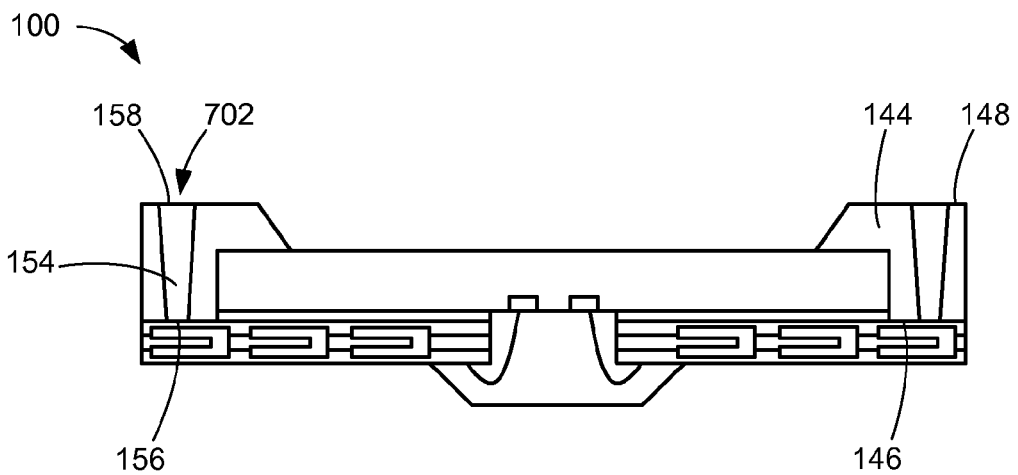
FIG. 8 is the structure of FIG. 7 in a filling phase.

Referring now to FIG. 8, therein is shown the structure of FIG. 7 in a filling phase. The integrated circuit packaging system 100 can include a conductor filling process including plating or screen-printing. The upper insulation holes 702 can be filled with an electrically conductive material to form the peripheral through-insulation connectors 154.

The peripheral through-insulation connectors 154 can be formed through the upper insulation bottom side 146 and the upper insulation top side 148. Planes of the peripheral connector bottom side 156 and the peripheral connector top side 158 can be coplanar with planes of the upper insulation bottom side 146 and the upper insulation top side 148, respectively. The peripheral connector top side 158 can be exposed from the upper insulation 144.

Figure 9:
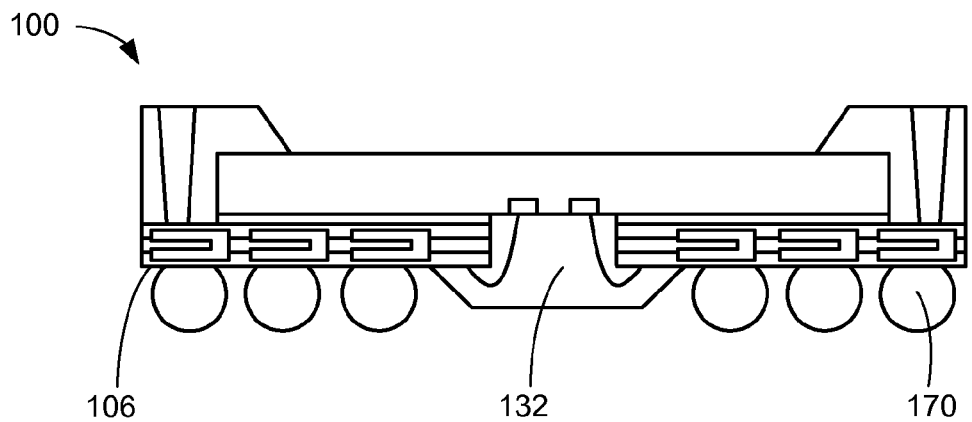
FIG. 9 is the structure of FIG. 8 in a connector-attaching phase.

Referring now to FIG. 9, therein is shown the structure of FIG. 8 in a connector-attaching phase. The integrated circuit packaging system 100 can include the package interconnects 170 attached to the package substrate bottom side 106.

The package interconnects 170 can be formed in multiple rows or a peripheral array surrounding the lower insulation 132. The package interconnects 170 are preferably electrical connectors, such as conductive bumps.

Figure 10:
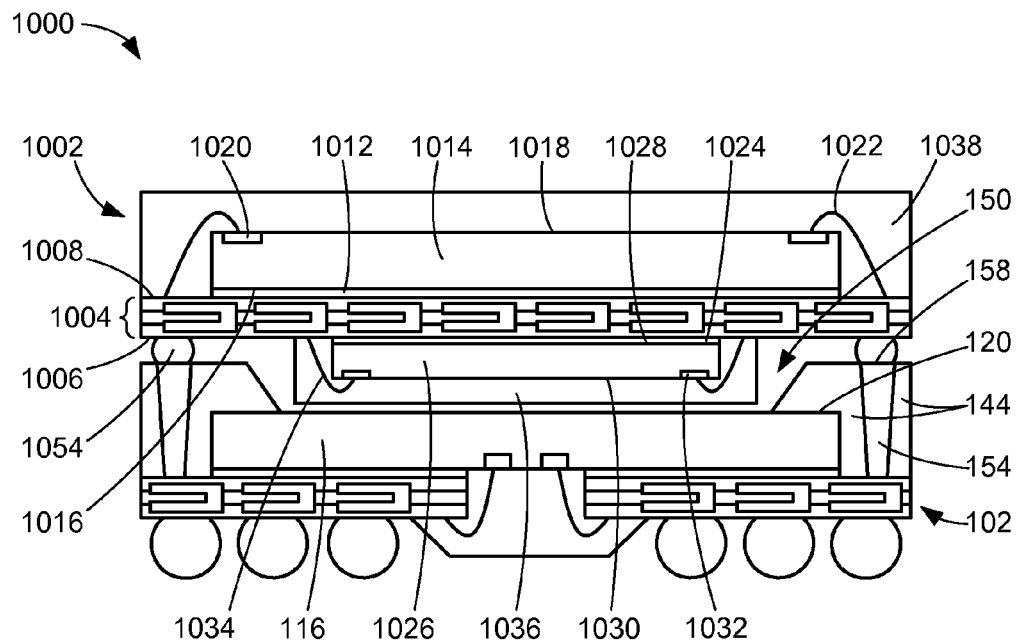
FIG. 10 is a cross-sectional view of an integrated circuit packaging system in a second embodiment of the present invention.

Referring now to FIG. 10, therein is shown a cross-sectional view of an integrated circuit packaging system 1000 in a second embodiment of the present invention. The integrated circuit packaging system 1000 can include a top structure 1002.

The top structure 1002 can include a top substrate 1004 having a top substrate bottom side 1006 and a top substrate top side 1008 opposite the top substrate bottom side 1006. The top structure 1002 can include a top device attach layer 1012 attached to the top substrate 1004 and a top device 1014.

The top device attach layer 1012 can be attached to the top substrate top side 1008 and a top device inactive side 1016 of the top device 1014.

The top device 1014 can include a top device active side 1018 opposite the top device inactive side 1016. The top device 1014 is preferably a semiconductor device, such as a chip or an integrated circuit die.

The top device 1014 can include top device pads 1020 at a peripheral region of the top device 1014 at the top device active side 1018. The top device 1014 can be mounted over the top substrate 1004 with the top device inactive side 1016 facing the top substrate top side 1008.

The top structure 1002 can include top device connectors 1022 providing electrical conductivity the top device pads 1020 and the top substrate top side 1008. A number of the top device connectors 1022 can be formed adjacent non-horizontal sides of the top device 1014.

The top structure 1002 can include a top component attach layer 1024 attached to the top substrate 1004 and a top component 1026. The top component attach layer 1024 can be attached to the top substrate bottom side 1006 and a top component inactive side 1028 of the top component 1026.

The top component 1026 can include a top component active side 1030 opposite the top component inactive side 1028. The top component 1026 is preferably a semiconductor device, such as a chip or an integrated circuit die.

The top component 1026 can include top component pads 1032 at a peripheral region of the top component 1026 at the top component active side 1030. The top component 1026 can be mounted over the top substrate 1004 with the top component inactive side 1028 facing the top substrate bottom side 1006.

The top structure 1002 can include top component connectors 1034 connected or attached to the top component pads 1032 and the top substrate bottom side 1006 providing electrical conductivity. A number of the top component connectors 1034 can be formed adjacent non-horizontal sides of the top component 1026.

The top structure 1002 can include a top component insulation 1036, which covers a semiconductor component or an electrical connector providing mechanical and environmental protection. The top component insulation 1036 can be applied over the top component attach layer 1024, the top component 1026, and the top component connectors 1034.

The top structure 1002 can include a top device insulation 1038, which covers a semiconductor component or an electrical connector providing mechanical and environmental protection. The top device insulation 1038 can be applied over the top device attach layer 1012, the top device 1014, and the top device connectors 1022.

The top structure 1002 can be mounted over the peripheral through-insulation connectors 154 of the stack structure 102. The top substrate bottom side 1006 of the top substrate 1004 can be mounted over the peripheral through-insulation connectors 154. The top substrate bottom side 1006 or the top component active side 1030 can be facing the base inactive side 120.

The top structure 1002 can be connected or attached to the stack structure 102 with top interconnects 1054. Each of the top interconnects 1054 can be attached to the top substrate bottom side 1006 and the peripheral connector top side 158 of each of the peripheral through-insulation connectors 154 providing electrical conductivity. The top interconnects 1054 can surround the top component insulation 1036.

The top component 1026 attached to the top substrate bottom side 1006 can be over the upper insulation 144 and the base integrated circuit 116. A portion of the top component 1026 or a portion of the top component insulation 1036 can be over or within the upper insulation cavity 150.

It has been discovered that the upper insulation 144 eliminates package-mounting alignment with the upper insulation cavity 150 providing spacing for mounting the top structure 1002 having the top component 1026 over the upper insulation cavity 150.

Figure 11:
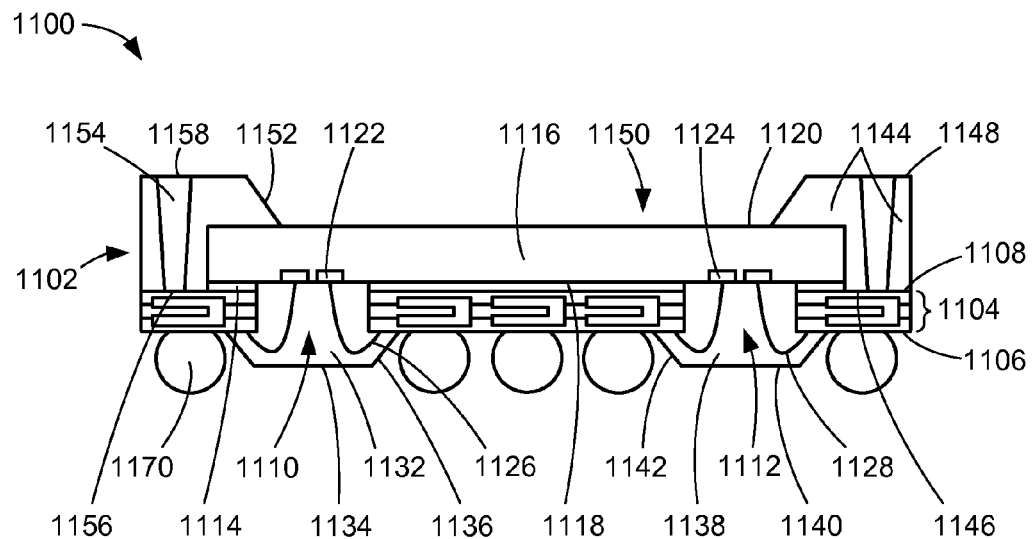
FIG. 11 is a cross-sectional view of an integrated circuit packaging system in a third embodiment of the present invention.

Referring now to FIG. 11, therein is shown a cross-sectional view of an integrated circuit packaging system 1100 in a third embodiment of the present invention. The integrated circuit packaging system 1100 can include a multi-side window structure. The integrated circuit packaging system 1100 can be similar to the integrated circuit packaging system 100 of FIG. 1, except for the formation of the base integrated circuit 116 of FIG. 1 and additions of a connector and an insulation.

The integrated circuit packaging system 1100 can include a stack structure 1102. The stack structure 1102 can include a package substrate 1104 having a package substrate bottom side 1106 and a package substrate top side 1108 opposite the package substrate bottom side 1106.

The package substrate 1104 can include a first package substrate window 1110 and a second package substrate window 1112, which are holes through the package substrate 1104, through the package substrate bottom side 1106 and the package substrate top side 1108. The package substrate 1104 can include a number of conductive layers providing electrical connectivity between the package substrate bottom side 1106 and the package substrate top side 1108.

The stack structure 1102 can include an adhesive layer 1114 attached to the package substrate 1104 and a base integrated circuit 1116. The adhesive layer 1114 can be attached to the package substrate top side 1108 and a base active side 1118 of the base integrated circuit 1116.

The base integrated circuit 1116 can include the base active side 1118 facing the package substrate top side 1108. The base integrated circuit 1116 can include a base inactive side 1120 opposite the base active side 1118.

The base integrated circuit 1116 can include first base pads 1122 at the base active side 1118 near a non-horizontal side of the base integrated circuit 1116. The base integrated circuit 1116 can include second base pads 1124 at the base active side 1118 near another non-horizontal side of the base integrated circuit 1116. The base integrated circuit 1116 can be mounted over the package substrate 1104 with the first base pads 1122 and the second base pads 1124 above the first package substrate window 1110 and the second package substrate window 1112, respectively.

The stack structure 1102 can include first lower internal connectors 1126 connected or attached to the first base pads 1122 and the package substrate bottom side 1106 providing electrical conductivity. A number of the first lower internal connectors 1126 can be formed through the first package substrate window 1110.

The stack structure 1102 can include a first lower insulation 1132, which covers a semiconductor component or an electrical connector providing mechanical and environmental protection. The first lower insulation 1132 can be applied over a portion of the package substrate bottom side 1106, the first package substrate window 1110, a portion of the base active side 1118, and the first lower internal connectors 1126.

The first lower insulation 1132 can include a first lower insulation bottom side 1134 below the package substrate bottom side 1106. The first lower insulation 1132 can include a first lower insulation sidewall 1136 at an obtuse angle to the first lower insulation bottom side 1134 or at an acute angle to a portion of the package substrate bottom side 1106 that is covered with the first lower insulation 1132.

The stack structure 1102 can include second lower internal connectors 1128 connected or attached to the second base pads 1124 and the package substrate bottom side 1106 providing electrical conductivity. A number of the second lower internal connectors 1128 can be formed through the second package substrate window 1112.

The stack structure 1102 can include a second lower insulation 1138, which covers a semiconductor component or an electrical connector providing mechanical and environmental protection. The second lower insulation 1138 can be applied over a portion of the package substrate bottom side 1106, the second package substrate window 1112, a portion of the base active side 1118, and the second lower internal connectors 1128.

The second lower insulation 1138 can include a second lower insulation bottom side 1140 below the package substrate bottom side 1106. The second lower insulation 1138 can include a second lower insulation sidewall 1142 at an obtuse angle to the second lower insulation bottom side 1140 or at an acute angle to a portion of the package substrate bottom side 1106 that is covered with the second lower insulation 1138.

The stack structure 1102 can include an upper insulation 1144, which covers a semiconductor component or an electrical connector providing mechanical and environmental protection. The upper insulation 1144 can be applied over the base inactive side 1120, the adhesive layer 1114, and the package substrate top side 1108. The upper insulation 1144 can include an upper insulation bottom side 1146 directly on the package substrate top side 1108.

The upper insulation 1144 can include an upper insulation top side 1148 opposite the upper insulation bottom side 1146 and above the base inactive side 1120. The upper insulation 1144 can include an upper insulation cavity 1150 at the upper insulation top side 1148.

The upper insulation 1144 can include an upper insulation sidewall 1152 bounding horizontal extents of the upper insulation cavity 1150. The base inactive side 1120 defines a bottom extent of the upper insulation cavity 1150. The upper insulation sidewall 1152 can be at an acute angle to a portion of the base inactive side 1120 that is covered with the upper insulation 1144.

The stack structure 1102 can include peripheral through-insulation connectors 1154 through the upper insulation 1144 and adjacent a periphery of the upper insulation 1144 providing electrical conductivity. The peripheral through-insulation connectors 1154 can surround non-horizontal sides of the base integrated circuit 1116.

Each of the peripheral through-insulation connectors 1154 can include a peripheral connector bottom side 1156 directly on the package substrate top side 1108. Each of the peripheral through-insulation connectors 1154 can include a peripheral connector top side 1158 opposite the peripheral connector bottom side 1156.

The peripheral connector top side 1158 can be exposed from the upper insulation 1144 at the upper insulation top side 1148. A plane of the peripheral connector top side 1158 can be coplanar with a plane of the upper insulation top side 1148.

The integrated circuit packaging system 1100 can include package interconnects 1170. The package interconnects 1170 can be attached to the package substrate bottom side 1106 providing electrical conductivity. The package interconnects 1170 can be formed in multiple rows or a peripheral array surrounding the first lower insulation 1132.

It has been discovered that the package substrate 1104 significantly reduces a package profile by providing the first package substrate window 1110 and the second package substrate window 1112 as through holes for attaching the first lower internal connectors 1126 and the second lower internal connectors 1128, respectively, to the base integrated circuit 1116 and the package substrate 1104.

Figure 12:
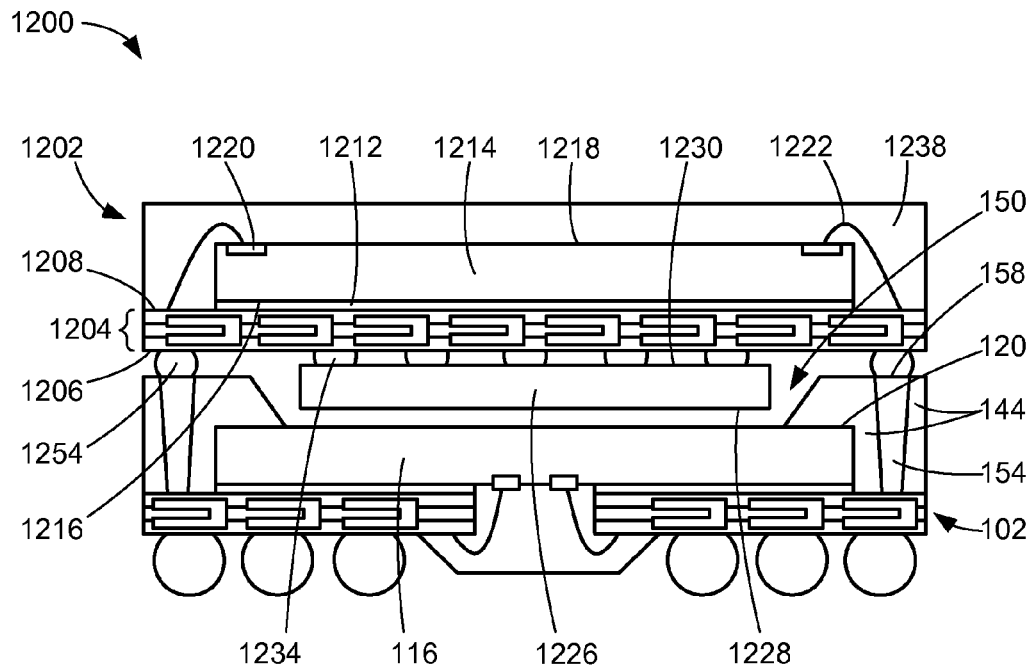
FIG. 12 is a cross-sectional view of an integrated circuit packaging system in a fourth embodiment of the present invention.

Referring now to FIG. 12, therein is shown a cross-sectional view of an integrated circuit packaging system 1200 in a fourth embodiment of the present invention. The integrated circuit packaging system 1200 can include a top package having a flip chip.

The integrated circuit packaging system 1200 can include a top structure 1202. The top structure 1202 can include a top substrate 1204 having a top substrate bottom side 1206 and a top substrate top side 1208 opposite the top substrate bottom side 1206.

The top structure 1202 can include a top device attach layer 1212 attached to the top substrate 1204 and a top device 1214. The top device attach layer 1212 can be attached to the top substrate top side 1208 and a top device inactive side 1216 of the top device 1214. The top device 1214 can include a top device active side 1218 opposite the top device inactive side 1216.

The top device 1214 can include top device pads 1220 at a peripheral region of the top device 1214 at the top device active side 1218. The top device 1214 can be mounted over the top substrate 1204 with the top device inactive side 1216 facing the top substrate top side 1208.

The top structure 1202 can include top device connectors 1222 connected or attached to the top device pads 1220 and the top substrate top side 1208 providing electrical conductivity. A number of the top device connectors 1222 can be formed adjacent non-horizontal sides of the top device 1214.

The top structure 1202 can include a top component 1226. The top component 1226 can include a top component inactive side 1228 and a top component active side 1230 opposite the top component inactive side 1228. The top component 1226 can be mounted over the top substrate 1204 with the top component active side 1230 facing the top substrate bottom side 1206. The top component 1226 is preferably a semiconductor device, such as a flip chip or an integrated circuit die.

The top structure 1202 can include a number of top component connectors 1234. The top component connectors 1234 can be connected or attached to the top component active side 1230 and the top substrate bottom side 1206 providing electrical conductivity.

The top structure 1202 can include a top device insulation 1238, which covers a semiconductor component or an electrical connector providing mechanical and environmental protection. The top device insulation 1238 can be applied over the top device attach layer 1212, the top device 1214, and the top device connectors 1222.

The top structure 1202 can be mounted over the peripheral through-insulation connectors 154 of the stack structure 102. The top substrate bottom side 1206 of the top substrate 1204 can be mounted over the peripheral through-insulation connectors 154. The top substrate bottom side 1206 or the top component inactive side 1228 can be facing the base inactive side 120.

The top structure 1202 can be connected or attached to the stack structure 102 with top interconnects 1254. Each of the top interconnects 1254 can be attached to the top substrate bottom side 1206 and the peripheral connector top side 158 of each of the peripheral through-insulation connectors 154 providing electrical conductivity. The top interconnects 1254 can surround the top component 1226.

The top component 1226 attached to the top substrate bottom side 1206 can be over the upper insulation 144 and the base integrated circuit 116. A portion of the top component 1226 can be over or within the upper insulation cavity 150.

It has been discovered that the upper insulation 144 reduces a package profile with the upper insulation cavity 150 providing spacing for mounting the top structure 1202 having a flip chip, such as the top component 1226, over the upper insulation cavity 150.

Figure 13:
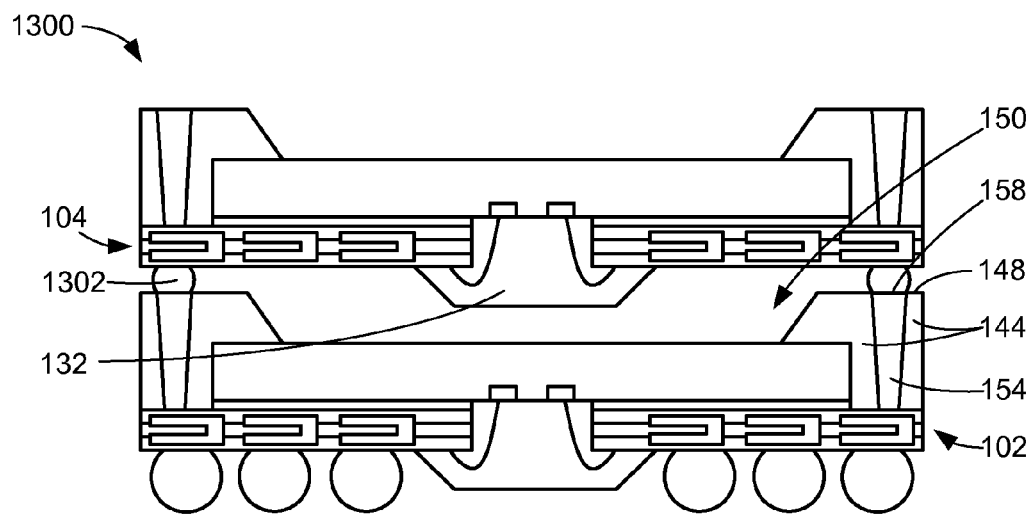
FIG. 13 is a cross-sectional view of an integrated circuit packaging system in a fifth embodiment of the present invention.

Referring now to FIG. 13, therein is shown a cross-sectional view of an integrated circuit packaging system 1300 in a fifth embodiment of the present invention. The integrated circuit packaging system 1300 can include another of the stack structure 102 mounted over the stack structure 102. Another of the lower insulation 132 of the another of the stack structure 102 can be over the upper insulation cavity 150 of the upper insulation 144.

The another of the stack structure 102 can be attached to the stack structure 102 with stack interconnects 1302. The stack interconnects 1302 can be connected or attached to another of the package substrate 104 of the another of the stack structure 102 and the peripheral connector top side 158 of each the peripheral through-insulation connectors 154 providing electrical conductivity.

It has been discovered that the peripheral through-insulation connectors 154 significantly reduce overall profile for mounting the another of the stack structure 102 over the stack structure 102 due to the peripheral connector top side 158 coplanar with the upper insulation top side 148.

Figure 14:
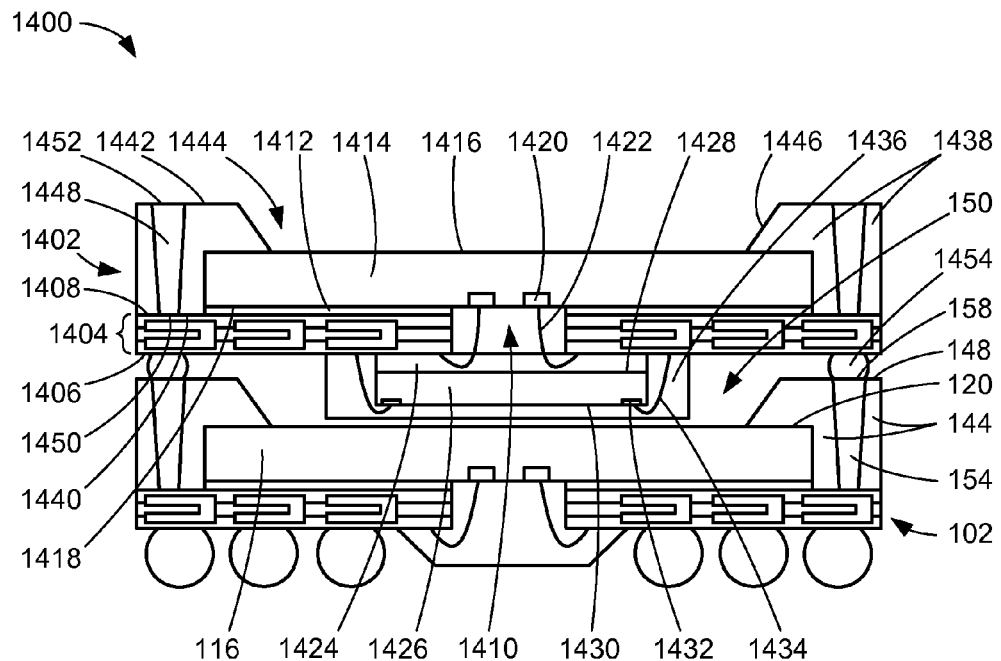
FIG. 14 is a cross-sectional view of an integrated circuit packaging system in a sixth embodiment of the present invention.

Referring now to FIG. 14, therein is shown a cross-sectional view of an integrated circuit packaging system 1400 in a sixth embodiment of the present invention. The integrated circuit packaging system 1400 can include a stack structure.

The integrated circuit packaging system 1400 can include a top structure 1402. The top structure 1402 can include a top substrate 1404 having a top substrate bottom side 1406 and a top substrate top side 1408 opposite the top substrate bottom side 1406.

The top substrate 1404 can include a top substrate window 1410, such as a hole through the top substrate bottom side 1406 and the top substrate top side 1408. The top substrate 1404 can include a number of conductive layers providing electrical connectivity between the top substrate bottom side 1406 and the top substrate top side 1408.

The top structure 1402 can include a top device attach layer 1412 and a top device 1414. The top device 1414 can include a top device inactive side 1416 and a top device active side 1418 opposite the top device inactive side 1416.

The top device 1414 can be mounted over the top substrate 1404 with the top device active side 1418 facing the top substrate top side 1408. The top device 1414 can include top device pads 1420 at a central region of the top device active side 1418.

The top device attach layer 1412 can be attached to the top substrate 1404 and the top device 1414. The top device attach layer 1412 can be attached to the top substrate top side 1408 and the top device active side 1418.

The top structure 1402 can include top device connectors 1422 connected or attached to the top device pads 1420 and the top substrate bottom side 1406 providing electrical conductivity. A number of the top device connectors 1422 can be formed through the top substrate window 1410.

The top structure 1402 can include a top component attach layer 1424 and a top component 1426. The top component 1426 can include a top component inactive side 1428 and a top component active side 1430 opposite the top component inactive side 1428.

The top component 1426 can be mounted over the top substrate 1404 with the top component inactive side 1428 facing the top substrate bottom side 1406. The top component 1426 can include top component pads 1432 at a peripheral region of the top component 1426 at the top component active side 1430.

The top component attach layer 1424 can be attached to the top substrate 1404 and the top component 1426. The top component attach layer 1424 can be attached to the top substrate bottom side 1406 and the top component inactive side 1428.

The top structure 1402 can include top component connectors 1434 connected or attached to the top component pads 1432 and the top substrate bottom side 1406 providing electrical conductivity. A number of the top component connectors 1434 can be formed adjacent non-horizontal sides of the top component 1426.

The top structure 1402 can include a top component insulation 1436, which covers a semiconductor component or an electrical connector providing mechanical and environmental protection. The top component insulation 1436 can be applied over the top component attach layer 1424, the top component 1426, and the top component connectors 1434.

The top structure 1402 can include a top device insulation 1438, which covers a semiconductor component or an electrical connector providing mechanical and environmental protection. The top device insulation 1438 can be applied over the top device inactive side 1416, the top device attach layer 1412, and the top substrate top side 1408. The top device insulation 1438 can include a top device insulation bottom side 1440 directly on the top substrate top side 1408.

The top device insulation 1438 can include a top device insulation top side 1442 opposite the top device insulation bottom side 1440 and above the top device inactive side 1416. The top device insulation 1438 can include a top device insulation cavity 1444 at the top device insulation top side 1442.

The top device insulation 1438 can include a top device insulation sidewall 1446 bounding horizontal extents of the top device insulation cavity 1444. The top device inactive side 1416 defines a bottom extent of the top device insulation cavity 1444. The top device insulation sidewall 1446 can be at an acute angle to a portion of the top device inactive side 1416 that is covered with the top device insulation 1438.

The top structure 1402 can include top through-insulation connectors 1448 through the top device insulation 1438 and adjacent a periphery of the top device insulation 1438 providing electrical conductivity. The top through-insulation connectors 1448 can surround non-horizontal sides of the top device 1414.

Each of the top through-insulation connectors 1448 can include a top connector bottom side 1450 directly on the top substrate top side 1408. Each of the top through-insulation connectors 1448 can include a top connector top side 1452 opposite the top connector bottom side 1450.

The top connector top side 1452 can be exposed from the top device insulation 1438 at the top device insulation top side 1442. A plane of the top connector top side 1452 can be coplanar with a plane of the top device insulation top side 1442.

The top substrate 1404 of the top structure 1402 can be mounted over the peripheral through-insulation connectors 154 of the stack structure 102. The top substrate bottom side 1406 of the top substrate 1404 can be facing the upper insulation top side 148, the peripheral connector top side 158, and the base inactive side 120.

The top structure 1402 can be connected to the stack structure 102 with top interconnects 1454. Each of the top interconnects 1454 can be attached to the top substrate bottom side 1406 and the peripheral connector top side 158 of each of the peripheral through-insulation connectors 154 providing electrical conductivity. The top interconnects 1454 can surround the top component insulation 1436.

The top component 1426 attached to the top substrate bottom side 1406 can be over the upper insulation 144 and the base integrated circuit 116. A portion of the top component 1426 or a portion of the top component insulation 1436 covering the top component 1426 can be within the upper insulation cavity 150.

It has been discovered that the peripheral through-insulation connectors 154 significantly reduce overall profile for mounting the top structure 1402 over the stack structure 102 due to the peripheral connector top side 158 coplanar with the upper insulation top side 148.

Figure 15:
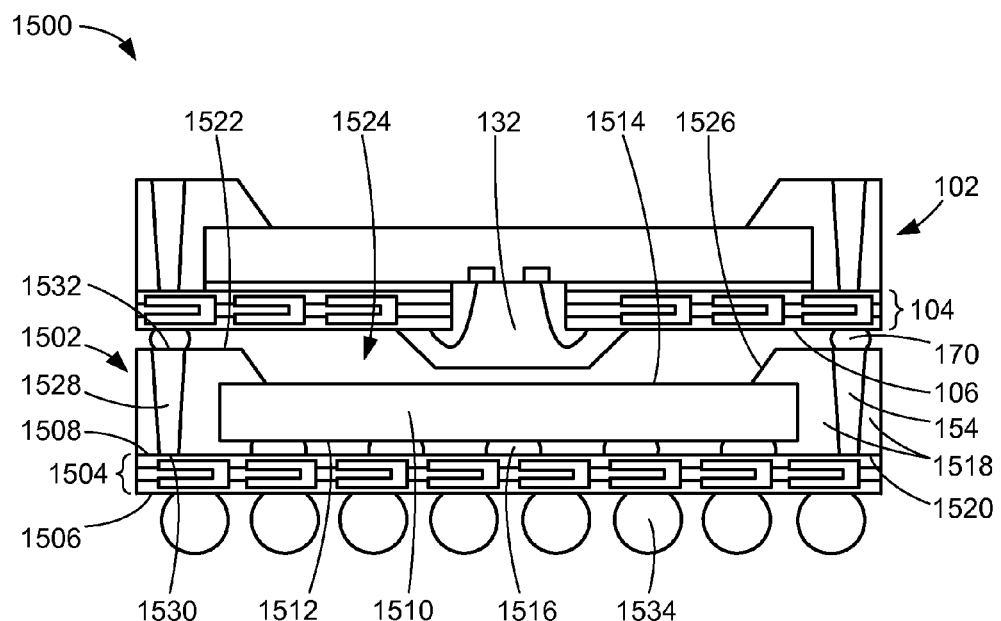
FIG. 15 is a cross-sectional view of an integrated circuit packaging system in a seventh embodiment of the present invention.

Referring now to FIG. 15, therein is shown a cross-sectional view of an integrated circuit packaging system 1500 in a seventh embodiment of the present invention. The integrated circuit packaging system 1500 can include a bottom package having a fan-in package-on-package (Fi-PoP) structure.

The integrated circuit packaging system 1500 can include a bottom structure 1502. The bottom structure 1502 can include a bottom substrate 1504 having a bottom substrate bottom side 1506 and a bottom substrate top side 1508 opposite the bottom substrate bottom side 1506. The bottom substrate 1504 can include a number of conductive layers providing electrical connectivity between the bottom substrate bottom side 1506 and the bottom substrate top side 1508.

The bottom structure 1502 can include a bottom device 1510. The bottom device 1510 is preferably a semiconductor device, such as a flip chip or an integrated circuit die.

The bottom device 1510 can include a bottom device active side 1512 and a bottom device inactive side 1514 opposite the bottom device active side 1512. The bottom device 1510 can be mounted over the bottom substrate 1504 with the bottom device active side 1512 facing the bottom substrate top side 1508.

The bottom structure 1502 can include a number of bottom device connectors 1516. The bottom device connectors 1516 can be connected or attached to the bottom device active side 1512 and the bottom substrate top side 1508 providing electrical conductivity.

The bottom structure 1502 can include a bottom device insulation 1518, which covers a semiconductor component or an electrical connector providing mechanical and environmental protection. The bottom device insulation 1518 can be applied over the bottom device inactive side 1514 and the bottom substrate top side 1508. The bottom device insulation 1518 can include a bottom device insulation bottom side 1520 directly on the bottom substrate top side 1508.

The bottom device insulation 1518 can include a bottom device insulation top side 1522 opposite the bottom device insulation bottom side 1520 and above the bottom device inactive side 1514. The bottom device insulation 1518 can include a bottom device insulation cavity 1524 at the bottom device insulation top side 1522.

The bottom device insulation 1518 can include a bottom device insulation sidewall 1526 bounding horizontal extents of the bottom device insulation cavity 1524. The bottom device inactive side 1514 defines a bottom extent of the bottom device insulation cavity 1524. The bottom device insulation sidewall 1526 can be at an acute angle to a portion of the bottom device inactive side 1514 that is covered with the bottom device insulation 1518.

The bottom structure 1502 can include bottom through-insulation connectors 1528 through the bottom device insulation 1518 and adjacent a periphery of the bottom device insulation 1518 providing electrical conductivity. The bottom through-insulation connectors 1528 can surround non-horizontal sides of the bottom device 1510.

Each of the bottom through-insulation connectors 1528 can include a bottom connector bottom side 1530 directly on the bottom substrate top side 1508. Each of the bottom through-insulation connectors 1528 can include a bottom connector top side 1532 opposite the bottom connector bottom side 1530.

The bottom connector top side 1532 can be exposed from the bottom device insulation 1518 at the bottom device insulation top side 1522. A plane of the bottom connector top side 1532 can be coplanar with a plane of the bottom device insulation top side 1522.

The integrated circuit packaging system 1500 can include bottom interconnects 1534. The bottom interconnects 1534 can be attached to the bottom substrate bottom side 1506 providing electrical conductivity. The bottom interconnects 1534 can be formed in multiple rows or an area array directly on the bottom substrate bottom side 1506.

The package substrate 104 of the stack structure 102 can be mounted over the bottom through-insulation connectors 1528 of the bottom structure 1502. The package substrate bottom side 106 of the package substrate 104 can be facing the bottom device inactive side 1514 of the bottom device 1510 of the bottom structure 1502.

The stack structure 102 can be connected to the bottom structure 1502 with the package interconnects 170. Each of the package interconnects 170 can be attached to the package substrate bottom side 106 and the bottom connector top side 1532 of each of the bottom through-insulation connectors 1528.

The lower insulation 132 of the stack structure 102 can be over the bottom device insulation 1518 and the bottom device 1510. A portion of the lower insulation 132 can be within the bottom device insulation cavity 1524.

It has been discovered that the peripheral through-insulation connectors 154 significantly reduce overall profile for mounting the stack structure 102 over the bottom structure 1502 due to the bottom connector top side 1532 coplanar with the bottom device insulation top side 1522.

Figure 16:
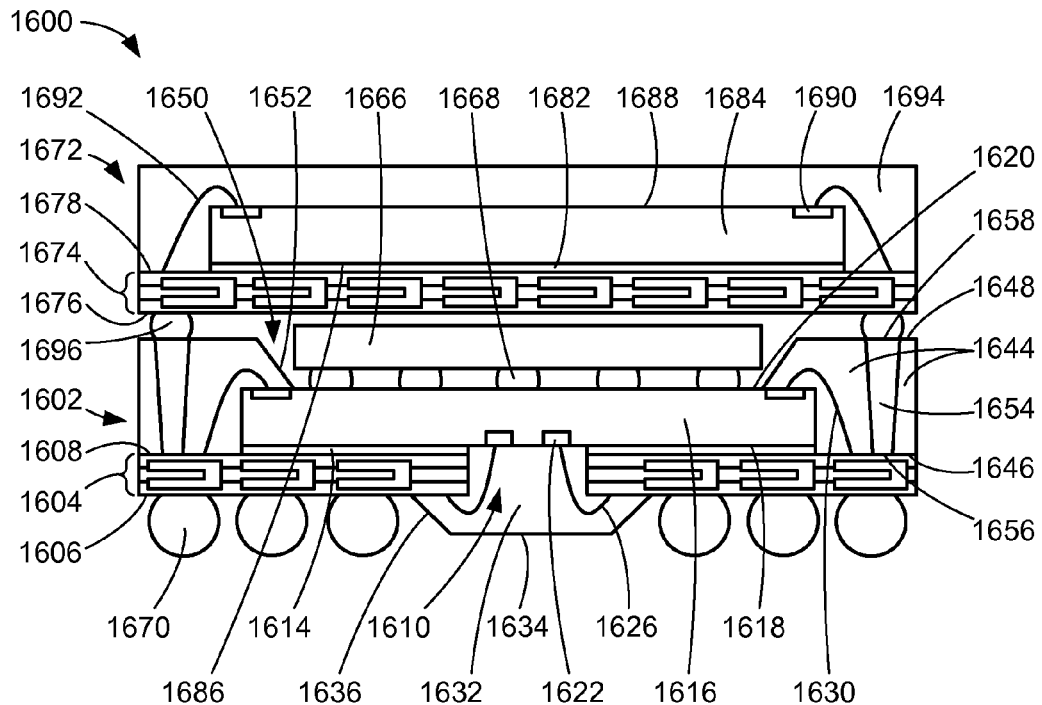
FIG. 16 is a cross-sectional view of an integrated circuit packaging system in an eighth embodiment of the present invention.

Referring now to FIG. 16, therein is shown a cross-sectional view of an integrated circuit packaging system 1600 in an eighth embodiment of the present invention. The integrated circuit packaging system 1600 can include a package stack structure with a flip chip.

The integrated circuit packaging system 1600 can include a stack structure 1602. The stack structure 1602 can include a package substrate 1604 having a package substrate bottom side 1606 and a package substrate top side 1608 opposite the package substrate bottom side 1606.

The package substrate 1604 can include a package substrate window 1610, such as a hole through the package substrate bottom side 1606 and the package substrate top side 1608. The package substrate 1604 can include a number of conductive layers providing electrical connectivity between the package substrate bottom side 1606 and the package substrate top side 1608.

The stack structure 1602 can include an adhesive layer 1614 attached to the package substrate 1604 and a base integrated circuit 1616. The adhesive layer 1614 can be attached to the package substrate top side 1608 and a base active side 1618 of the base integrated circuit 1616.

The base integrated circuit 1616 can include the base active side 1618 facing the package substrate top side 1608. The base integrated circuit 1616 can include a base inactive side 1620 opposite the base active side 1618.

The base integrated circuit 1616 can include base pads 1622 at a central region of the base active side 1618 or at a peripheral region of the base inactive side 1620. The base integrated circuit 1616 can be mounted over the package substrate 1604 with one of the base pads 1622 above the package substrate window 1610.

The base integrated circuit 1616 can include a redistribution layer (RDL) (not shown) for distributing electrical signals of a top package or a known good unit (KGU). The redistribution layer can be formed directly on a backside, such as the base inactive side 1620, at wafer level stage.

The stack structure 1602 can include lower internal connectors 1626 connected or attached to the package substrate bottom side 1606 and the base pads 1622 at the base active side 1618 providing electrical conductivity. A number of the lower internal connectors 1626 can be formed through the package substrate window 1610.

The stack structure 1602 can include upper internal connectors 1630 connected or attached to the package substrate top side 1608 and the base pads 1622 at the base inactive side 1620 providing electrical conductivity. The upper internal connectors 1630 can be connected or attached to the redistribution layer (RDL) to connect a top package or a known good unit (KGU) to the package substrate top side 1608. A number of the upper internal connectors 1630 can be formed adjacent non-horizontal sides of the base integrated circuit 1616.

The stack structure 1602 can include a lower insulation 1632, which covers a semiconductor component or an electrical connector providing mechanical and environmental protection. The lower insulation 1632 can be applied over the package substrate bottom side 1606, the package substrate window 1610, the base active side 1618, and the lower internal connectors 1626.

The lower insulation 1632 can include a lower insulation bottom side 1634 below the package substrate bottom side 1606. The lower insulation 1632 can include a lower insulation sidewall 1636 at an obtuse angle to the lower insulation bottom side 1634 or at an acute angle to a portion of the package substrate bottom side 1606 that is covered with the lower insulation 1632.

The stack structure 1602 can include an upper insulation 1644, which covers a semiconductor component or an electrical connector providing mechanical and environmental protection. The upper insulation 1644 can be applied over the upper internal connectors 1630, the base inactive side 1620, the adhesive layer 1614, and the package substrate top side 1608. The upper insulation 1644 can include an upper insulation bottom side 1646 directly on the package substrate top side 1608.

The upper insulation 1644 can include an upper insulation top side 1648 opposite the upper insulation bottom side 1646 and above the base inactive side 1620. The upper insulation 1644 can include an upper insulation cavity 1650 at the upper insulation top side 1648.

The upper insulation 1644 can include an upper insulation sidewall 1652 bounding horizontal extents of the upper insulation cavity 1650. The base inactive side 1620 defines a bottom extent of the upper insulation cavity 1650. The upper insulation sidewall 1652 can be at an acute angle to a portion of the base inactive side 1620 that is covered with the upper insulation 1644.

The stack structure 1602 can include peripheral through-insulation connectors 1654 through the upper insulation 1644 and adjacent a periphery of the upper insulation 1644 providing electrical conductivity. The peripheral through-insulation connectors 1654 can surround non-horizontal sides of the base integrated circuit 1616. The upper internal connectors 1630 can be between the peripheral through-insulation connectors 1654 and the non-horizontal sides of the base integrated circuit 1616.

Each of the peripheral through-insulation connectors 1654 can include a peripheral connector bottom side 1656 directly on the package substrate top side 1608. Each of the peripheral through-insulation connectors 1654 can include a peripheral connector top side 1658 opposite the peripheral connector bottom side 1656.

The peripheral connector top side 1658 can be exposed from the upper insulation 1644 at the upper insulation top side 1648. A plane of the peripheral connector top side 1658 can be coplanar with a plane of the upper insulation top side 1648.

The stack structure 1602 can include a stack integrated circuit 1666, which is a semiconductor device, mounted over the base active side 1618. The stack integrated circuit 1666 can be within the upper insulation cavity 1650 or surrounded by the upper insulation sidewall 1652. The stack integrated circuit 1666 is preferably a semiconductor device, such as a flip chip or an integrated circuit die.

The stack structure 1602 can include stack connectors 1668 connected or attached to the stack integrated circuit 1666 and the base integrated circuit 1616 providing electrical conductivity. The stack connectors 1668 can be connected or attached to the stack integrated circuit 1666 and the redistribution layer (RDL) directly on the base inactive side 1620. The stack connectors 1668 can be electrically connected to the upper internal connectors 1630 with the redistribution layer (RDL).

The integrated circuit packaging system 1600 can include package interconnects 1670. The package interconnects 1670 can be attached to the package substrate bottom side 1606 providing electrical conductivity. The package interconnects 1670 can be formed in multiple rows or a peripheral array surrounding the lower insulation 1632.

The integrated circuit packaging system 1600 can include a top structure 1672. The top structure 1672 can include a top substrate 1674 having a top substrate bottom side 1676 and a top substrate top side 1678 opposite the top substrate bottom side 1676.

The top structure 1672 can include a top device attach layer 1682 attached to the top substrate 1674 and a top device 1684. The top device attach layer 1682 can be attached to the top substrate top side 1678 and a top device inactive side 1686 of the top device 1684. The top device 1684 can include a top device active side 1688 opposite the top device inactive side 1686.

The top device 1684 can include top device pads 1690 at a peripheral region of the top device 1684 at the top device active side 1688. The top device 1684 can be mounted over the top substrate 1674 with the top device inactive side 1686 facing the top substrate top side 1678.

The top structure 1672 can include top device connectors 1692 connected or attached to the top device pads 1690 and the top substrate top side 1678 providing electrical conductivity. A number of the top device connectors 1692 can be formed adjacent non-horizontal sides of the top device 1684.

The top structure 1672 can include a top device insulation 1694, which covers a semiconductor component or an electrical connector providing mechanical and environmental protection. The top device insulation 1694 can be applied over the top device attach layer 1682, the top device 1684, and the top device connectors 1692.

The top structure 1672 can be mounted over the stack structure 1602. The top substrate bottom side 1676 of the top substrate 1674 can be over the stack integrated circuit 1666.

The top structure 1672 can be connected to the stack structure 1602 with top interconnects 1696. Each of the top interconnects 1696 can be attached to the top substrate bottom side 1676 and the peripheral connector top side 1658 of each of the peripheral through-insulation connectors 1654 providing electrical conductivity. The top interconnects 1696 can surround the stack integrated circuit 1666.

It has been discovered that the stack structure 1602 having the upper internal connectors 1630 and the redistribution layer (RDL) improves z-interconnection by providing a fan-in stack structure of a board on chip (BOC) for connecting the stack integrated circuit 1666 to the base integrated circuit 1616.

Figure 17:
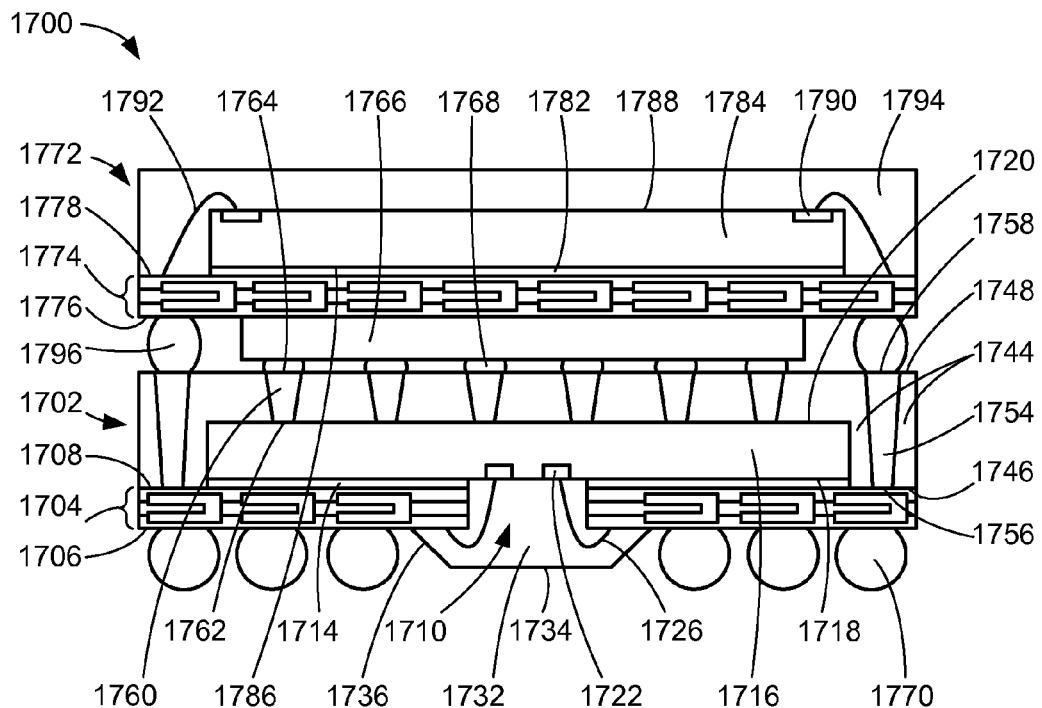
FIG. 17 is a cross-sectional view of an integrated circuit packaging system in a ninth embodiment of the present invention.

Referring now to FIG. 17, therein is shown a cross-sectional view of an integrated circuit packaging system 1700 in a ninth embodiment of the present invention. The integrated circuit packaging system 1700 can include a stack structure 1702.

The stack structure 1702 can include a package substrate 1704 having a package substrate bottom side 1706 and a package substrate top side 1708 opposite the package substrate bottom side 1706. The package substrate 1704 can include a package substrate window 1710, such as a hole through the package substrate bottom side 1706 and the package substrate top side 1708. The package substrate 1704 can include a number of conductive layers providing electrical connectivity between the package substrate bottom side 1706 and the package substrate top side 1708.

The stack structure 1702 can include an adhesive layer 1714 attached to the package substrate 1704 and a base integrated circuit 1716. The adhesive layer 1714 can be attached to the package substrate top side 1708 and a base active side 1718 of the base integrated circuit 1716.

The base integrated circuit 1716 can include the base active side 1718 facing the package substrate top side 1708. The base integrated circuit 1716 can include a base inactive side 1720 opposite the base active side 1718.

The base integrated circuit 1716 can include a redistribution layer (RDL) (not shown) for distributing electrical signals of a top package or a known good unit (KGU). The redistribution layer can be formed directly on a backside, such as the base inactive side 1720, at wafer level stage.

The base integrated circuit 1716 can include base pads 1722 at a central region of the base active side 1718. The base integrated circuit 1716 can be mounted over the package substrate 1704 with the base pads 1722 above the package substrate window 1710.

The stack structure 1702 can include lower internal connectors 1726 connected or attached to the base pads 1722 and the package substrate bottom side 1706 providing electrical conductivity. A number of the lower internal connectors 1726 can be formed through the package substrate window 1710.

The stack structure 1702 can include a lower insulation 1732, which covers a semiconductor component or an electrical connector providing mechanical and environmental protection. The lower insulation 1732 can be applied over the package substrate bottom side 1706, the package substrate window 1710, the base active side 1718, and the lower internal connectors 1726.

The lower insulation 1732 can include a lower insulation bottom side 1734 below the package substrate bottom side 1706. The lower insulation 1732 can include a lower insulation sidewall 1736 at an obtuse angle to the lower insulation bottom side 1734 or at an acute angle to a portion of the package substrate bottom side 1706 that is covered with the lower insulation 1732.

The stack structure 1702 can include an upper insulation 1744, which covers a semiconductor component or an electrical connector providing mechanical and environmental protection. The upper insulation 1744 can be applied over the base inactive side 1720, the adhesive layer 1714, and the package substrate top side 1708.

The upper insulation 1744 can include an upper insulation bottom side 1746 directly on the package substrate top side 1708. The upper insulation 1744 can include an upper insulation top side 1748 opposite the upper insulation bottom side 1746 and above the base inactive side 1720.

The stack structure 1702 can include peripheral through-insulation connectors 1754 through the upper insulation 1744 and adjacent a periphery of the upper insulation 1744 providing electrical conductivity. The peripheral through-insulation connectors 1754 can surround non-horizontal sides of the base integrated circuit 1716.

Each of the peripheral through-insulation connectors 1754 can include a peripheral connector bottom side 1756 directly on the package substrate top side 1708. Each of the peripheral through-insulation connectors 1754 can include a peripheral connector top side 1758 opposite the peripheral connector bottom side 1756.

The peripheral connector top side 1758 can be exposed from the upper insulation 1744 at the upper insulation top side 1748. A plane of the peripheral connector top side 1758 can be coplanar with a plane of the upper insulation top side 1748.

The stack structure 1702 can include central through-insulation connectors 1760 through the upper insulation 1744 and at a central region of the upper insulation 1744 providing electrical conductivity. A number of the central through-insulation connectors 1760 can be surrounded by the peripheral through-insulation connectors 1754.

Each of the central through-insulation connectors 1760 can include a central connector bottom side 1762 over or on the base inactive side 1720. The central through-insulation connectors 1760 can be connected or attached to the redistribution layer (RDL) at the base inactive side 1720. Each of the central through-insulation connectors 1760 can include a central connector top side 1764 opposite the central connector bottom side 1762.

The central connector top side 1764 can be exposed from the upper insulation 1744 at the upper insulation top side 1748. A plane of the central connector top side 1764 can be coplanar with a plane of the upper insulation top side 1748.

The stack structure 1702 can include a stack integrated circuit 1766, which is a semiconductor device, mounted over the central through-insulation connectors 1760. The stack integrated circuit 1766 is preferably a semiconductor device, such as a flip chip or an integrated circuit die.

The stack structure 1702 can include stack connectors 1768 connected or attached to the stack integrated circuit 1766 and the central through-insulation connectors 1760 providing electrical conductivity. The stack connectors 1768 can be connected or attached to the stack integrated circuit 1766 and the central connector top side 1764.

The integrated circuit packaging system 1700 can include package interconnects 1770. The package interconnects 1770 can be attached to the package substrate bottom side 1706 providing electrical conductivity. The package interconnects 1770 can be formed in multiple rows or a peripheral array surrounding the lower insulation 1732.

The integrated circuit packaging system 1700 can include a top structure 1772. The top structure 1772 can include a top substrate 1774 having a top substrate bottom side 1776 and a top substrate top side 1778 opposite the top substrate bottom side 1776.

The top structure 1772 can include a top device attach layer 1782 attached to the top substrate 1774 and a top device 1784. The top device attach layer 1782 can be attached to the top substrate top side 1778 and a top device inactive side 1786 of the top device 1784. The top device 1784 can include a top device active side 1788 opposite the top device inactive side 1786.

The top device 1784 can include top device pads 1790 at a peripheral region of the top device 1784 at the top device active side 1788. The top device 1784 can be mounted over the top substrate 1774 with the top device inactive side 1786 facing the top substrate top side 1778.

The top structure 1772 can include top device connectors 1792 connected or attached to the top device pads 1790 and the top substrate top side 1778 providing electrical conductivity. A number of the top device connectors 1792 can be formed adjacent non-horizontal sides of the top device 1784.

The top structure 1772 can include a top device insulation 1794, which covers a semiconductor component or an electrical connector providing mechanical and environmental protection. The top device insulation 1794 can be applied over the top device attach layer 1782, the top device 1784, and the top device connectors 1792.

The top structure 1772 can be mounted over the stack structure 1702. The top substrate bottom side 1776 of the top substrate 1774 can be over the stack integrated circuit 1766.

The top structure 1772 can be connected to the stack structure 1702 with top interconnects 1796. Each of the top interconnects 1796 can be attached to the top substrate bottom side 1776 and the peripheral connector top side 1758 of each of the peripheral through-insulation connectors 1754 providing electrical conductivity. The top interconnects 1796 can surround the stack integrated circuit 1766.

It has been discovered that the stack structure 1702 having the central through-insulation connectors 1760 and the redistribution layer (RDL) improves z-interconnection by providing a fan-in stack structure of a board on chip (BOC) for connecting the stack integrated circuit 1766 to the base integrated circuit 1716.

Figure 18:
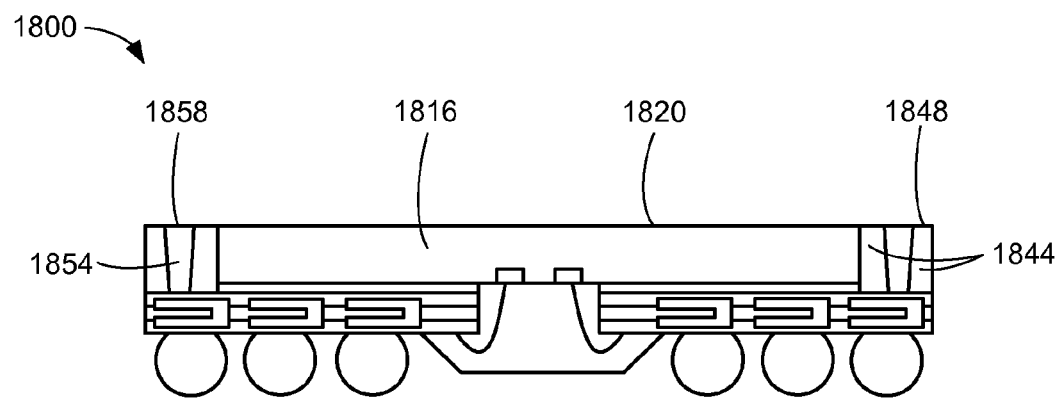
FIG. 18 is a cross-sectional view of an integrated circuit packaging system in a tenth embodiment of the present invention.

Referring now to FIG. 18, therein is shown a cross-sectional view of an integrated circuit packaging system 1800 in a tenth embodiment of the present invention. In a manner similar to the integrated circuit packaging system 100 of FIG. 1, the integrated circuit packaging system 1800 includes a base integrated circuit 1816 having a base inactive side 1820.

Also in a manner similar to the integrated circuit packaging system 100, the integrated circuit packaging system 1800 includes an upper insulation 1844 having an upper insulation top side 1848. Further, in a manner similar to the integrated circuit packaging system 100, the integrated circuit packaging system 1800 includes peripheral through-insulation connectors 1854, each of which having a peripheral connector top side 1858.

The upper insulation 1844 can fully expose the base inactive side 1820. Planes of the upper insulation top side 1848 and the peripheral connector top side 1858 can be coplanar to a plane of the base inactive side 1820.

It has been discovered that the upper insulation top side 1848 and the peripheral connector top side 1858 coplanar to the base inactive side 1820 as well as the base inactive side 1820 fully exposed from the upper insulation 1844 provide a low package height, low stacking height, and thereby improved electrical performance.

Figure 19:
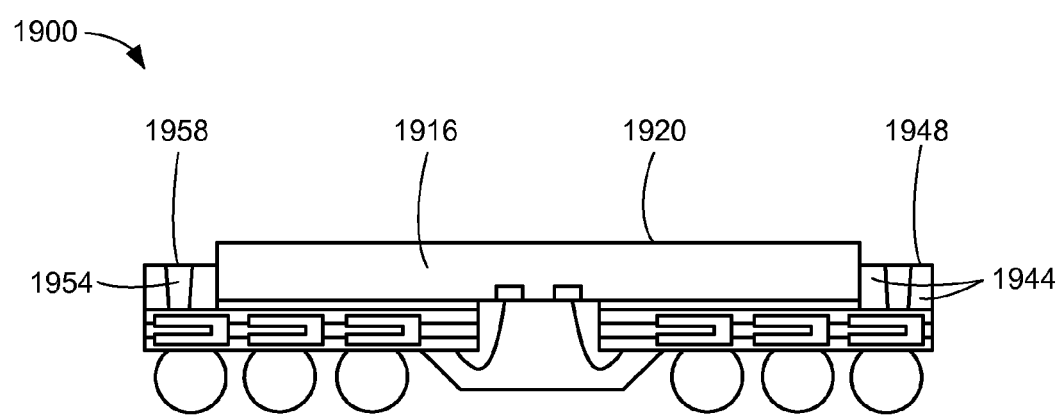
FIG. 19 is a cross-sectional view of an integrated circuit packaging system in an eleventh embodiment of the present invention.

Referring now to FIG. 19, therein is shown a cross-sectional view of an integrated circuit packaging system 1900 in an eleventh embodiment of the present invention. In a manner similar to the integrated circuit packaging system 100 of FIG. 1, the integrated circuit packaging system 1900 includes a base integrated circuit 1916 having a base inactive side 1920.

Also in a manner similar to the integrated circuit packaging system 100, the integrated circuit packaging system 1900 includes an upper insulation 1944 having an upper insulation top side 1948. Further, in a manner similar to the integrated circuit packaging system 100, the integrated circuit packaging system 1900 includes peripheral through-insulation connectors 1954, each of which having a peripheral connector top side 1958.

The upper insulation 1944 can fully expose the base inactive side 1920. The upper insulation 1944 can expose a portion of a non-horizontal side of the base integrated circuit 1916.

The base integrated circuit 1916 can protrude from the upper insulation top side 1948. A plane of the base inactive side 1920 can be above the planes of the upper insulation top side 1948 and the peripheral connector top side 1958.

It has been discovered that the upper insulation top side 1948 and the peripheral connector top side 1958 below the base inactive side 1920 as well as the base inactive side 1920 fully exposed from the upper insulation 1844 provide a low package height, very low stacking height, and thereby improved electrical performance.

Figure 20:
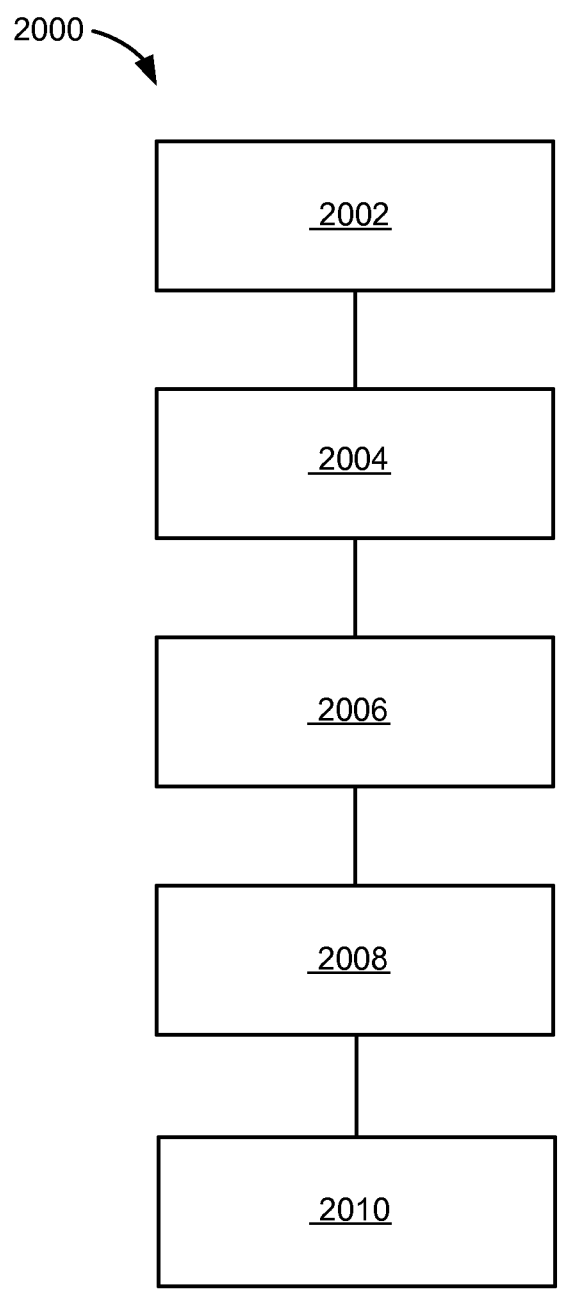
FIG. 20 is a flow chart of a method of manufacture of the integrated circuit packaging system in a further embodiment of the present invention.

Referring now to FIG. 20, therein is shown a flow chart of a method 2000 of manufacture of the integrated circuit packaging system 100 in a further embodiment of the present invention. The method 2000 includes: providing a package substrate having a package substrate bottom side, a package substrate top side, and a package substrate window in a block 2002; mounting a base integrated circuit over the package substrate, the base integrated circuit having a base inactive side and a base active side facing the package substrate top side in a block 2004; attaching a lower internal connector to the base active side and the package substrate bottom side, the lower internal connector through the package substrate window in a block 2006; forming an upper insulation conformal to the base integrated circuit and the package substrate top side, the upper insulation having an upper insulation top side in a block 2008; and forming a peripheral through-insulation connector through the upper insulation, the peripheral through-insulation connector having a peripheral connector bottom side directly on the package substrate top side and a peripheral connector top side coplanar with the upper insulation top side in a block 2010.

Thus, it has been discovered that the integrated circuit packaging system of the present invention furnishes important and heretofore unknown and unavailable solutions, capabilities, and functional aspects for an integrated circuit packaging system with interconnection. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing a package substrate having a package substrate bottom side, a package substrate top side, and a package substrate window;
    mounting a base integrated circuit over the package substrate, the base integrated circuit having a base inactive side and a base active side facing the package substrate top side;
    attaching a lower internal connector to the base active side and the package substrate bottom side, the lower internal connector through the package substrate window;
    forming an upper insulation conformal to the base integrated circuit and the package substrate top side, the upper insulation having an upper insulation top side above the base integrated circuit, the upper insulation having an upper insulation cavity at the upper insulation top side and in the upper insulation, wherein the upper insulation cavity provides spacing for mounting a top package within the upper insulation cavity and over the base integrated circuit;
    forming a peripheral through-insulation connector through the upper insulation, the peripheral through-insulation connector having a straight non-horizontal side within the upper insulation, a peripheral connector bottom side directly on the package substrate top side, and a peripheral connector top side coplanar with the upper insulation top side, wherein the base integrated circuit is below the peripheral connector top side and exposed from the upper insulation within the upper insulation cavity; and
    mounting a top structure, having a top substrate, on the peripheral through-insulation connector, a top component attached to a top substrate bottom side of the top structure and partially within the upper insulation cavity.

2. The method as claimed in claim 1 wherein forming the upper insulation includes forming the upper insulation having the upper insulation cavity exposing the base inactive side.

3. The method as claimed in claim 1 further comprising forming a central through-insulation connector through the upper insulation and over the base inactive side.

4. The method as claimed in claim 1 wherein forming the upper insulation includes forming the upper insulation with the base inactive side fully exposed from the upper insulation.

5. The method as claimed in claim 1 further comprising attaching a stack structure to the peripheral connector top side.

6. A method of manufacture of an integrated circuit packaging system comprising:
    providing a package substrate having a package substrate bottom side, a package substrate top side, and a package substrate window;

mounting a base integrated circuit over the package substrate, the base integrated circuit having a base inactive side and a base active side facing the package substrate top side;

attaching a lower internal connector to the base active side and the package substrate bottom side;

forming a lower insulation over the lower internal connector and the base integrated circuit;

forming an upper insulation conformal to the base integrated circuit and the package substrate top side, the upper insulation having an upper insulation top side above the base integrated circuit, the upper insulation having an upper insulation cavity at the upper insulation top side and in the upper insulation, wherein the upper insulation cavity provides spacing for mounting a top package within the upper insulation cavity and over the base integrated circuit;

forming a peripheral through-insulation connector through the upper insulation, the peripheral through-insulation connector having a straight non-horizontal side within the upper insulation, a peripheral connector bottom side directly on the package substrate top side, and a peripheral connector top side coplanar with the upper insulation top side, wherein the base integrated circuit is below the peripheral connector top side and exposed from the upper insulation within the upper insulation cavity; and mounting a top structure, having a top substrate, on the peripheral through-insulation connector, a top component attached to a top substrate bottom side of the top structure and partially within the upper insulation cavity.

7. The method as claimed in claim 6 further comprising connecting a stack integrated circuit to the base integrated circuit.

8. The method as claimed in claim 6 wherein mounting the top structure having the top component includes mounting the to structure over the upper insulation cavity.

9. The method as claimed in claim 6 wherein mounting the top structure having the top substrate bottom side on the peripheral through-insulation connector includes mounting the top structure with a top component active side connected to the top substrate bottom side, and a top component inactive side facing the base integrated circuit.

10. The method as claimed in claim 6 wherein mounting the top structure having the top substrate bottom side on the peripheral through-insulation connector includes mounting the top structure with a top component inactive side attached to the top substrate bottom side, and a top component active side facing the base integrated circuit.

11. An integrated circuit packaging system comprising:

a package substrate having a package substrate bottom side, a package substrate top side, and a package substrate window;

a base integrated circuit over the package substrate, the base integrated circuit having a base inactive side and a base active side facing the package substrate top side;

a lower internal connector attached to the base active side and the package substrate bottom side, the lower internal connector through the package substrate window;

an upper insulation conformal to the base integrated circuit and the package substrate top side, the upper insulation having an upper insulation top side above the base integrated circuit, the upper insulation having an upper insulation cavity at the upper insulation top side and in the upper insulation, wherein the upper insulation cavity provides spacing for mounting a top package within the upper insulation cavity and over the base integrated circuit;

a peripheral through-insulation connector through the upper insulation, the peripheral through-insulation connector having a straight non-horizontal side within the upper insulation, a peripheral connector bottom side directly on the package substrate top side, and a peripheral connector top side coplanar with the upper insulation top side, wherein the base integrated circuit is below the peripheral connector top side and exposed from the upper insulation within the upper insulation cavity;

a top structure, having a top substrate, connected to the peripheral through-insulation connector; and a top component attached to a to substrate bottom side of the top structure and partially within the upper insulation cavity.

12. The system as claimed in claim 11 wherein the upper insulation includes the upper insulation cavity exposing the base inactive side.

13. The system as claimed in claim 11 further comprising a central through-insulation connector through the upper insulation and over the base inactive side.

14. The system as claimed in claim 11 wherein the upper insulation fully exposes the base inactive side.

15. The system as claimed in claim 11 further comprising a stack structure attached to the peripheral connector top side.

16. The system as claimed in claim 11 further comprising a lower insulation over the lower internal connector and the base integrated circuit.

17. The system as claimed in claim 16 further comprising a stack integrated circuit connected to the base integrated circuit.

18. The system as claimed in claim 16 wherein the top structure and the top component are over the upper insulation cavity.

19. The system as claimed in claim 16 wherein:

the top substrate has the top substrate bottom side over the peripheral through-insulation connector;

a top component active side of the top component is connected to the top substrate bottom side; and a top component inactive side of the top component is facing the base integrated circuit.

20. The system as claimed in claim 16 wherein:

the top substrate has the top substrate bottom side over the peripheral through-insulation connector;

a top component inactive side of the top component is attached to the top substrate bottom side; and a top component active side of the top component is facing the base integrated circuit.

* * * * *

UNITED STATES PATENT AND TRADEMARK OFFICE
CERTIFICATE OF CORRECTION

| | | |
|---|---|---|
| PATENT NO. | : 9,093,392 B2 | Page 1 of 1 |
| APPLICATION NO. | : 12/965018 | |
| DATED | : July 28, 2015 | |
| INVENTOR(S) | : Cho et al. | |

It is certified that error appears in the above-identified patent and that said Letters Patent is hereby corrected as shown below:

In the Claims:

1. Column 23, Claim 8, line 36, delete "the to" and insert therefor --the top--

2. Column 24, Claim 11, line 20, delete "a to" and insert therefor --a top--

Signed and Sealed this
Fifth Day of April, 2016

Michelle K. Lee
*Director of the United States Patent and Trademark Office*